(12) United States Patent
Okamoto et al.

(10) Patent No.: US 6,922,126 B1
(45) Date of Patent: Jul. 26, 2005

(54) INDUCTOR ELEMENT

(75) Inventors: Akira Okamoto, Ageo (JP); Takeshi Ikeda, Tokyo (JP)

(73) Assignee: Niigata Seimitsu Co., Ltd., Jouetsu (JP)

(*) Notice: Subject to any disclaimer, the term of this patent is extended or adjusted under 35 U.S.C. 154(b) by 0 days.

(21) Appl. No.: 09/980,959

(22) PCT Filed: May 18, 1999

(86) PCT No.: PCT/JP99/02566
§ 371 (c)(1),
(2), (4) Date: Oct. 29, 2001

(87) PCT Pub. No.: WO00/70629
PCT Pub. Date: Nov. 23, 2000

(51) Int. Cl.$^7$ ................................. H01F 5/00
(52) U.S. Cl. ............................................ 336/200
(58) Field of Search .................. 336/65, 83, 90–96, 336/192, 200, 206–208, 232

(56) References Cited

U.S. PATENT DOCUMENTS

| | | | |
|---|---|---|---|
| 5,095,357 A | * | 3/1992 | Andoh et al. ............. 257/379 |
| 5,892,425 A | * | 4/1999 | Kuhn et al. ............... 336/200 |
| 6,466,122 B1 | * | 10/2002 | Hasegawa et al. ......... 336/200 |
| 6,476,704 B2 | * | 11/2002 | Goff ........................ 336/200 |

FOREIGN PATENT DOCUMENTS

| | | |
|---|---|---|
| EP | 0 643 402 | 3/1995 |
| JP | 7-336138 | 12/1995 |
| JP | 10-208940 | 8/1998 |

OTHER PUBLICATIONS

Patent Abstracts of Japan, vol. 1998, No. 13, Nov. 30, 1998, JP–A–10208940 (Abstract) Aug. 7, 1998.
Patent Abstracts of Japan, vol. 1995, No. 01, Feb. 28, 1995, JP–A–06302443 (Abstract) Oct. 28, 1994.
Patent Abstracts of Japan, vol. 011, No. 309 (E–547) Oct. 8, 1987, JP–A–62104013 (Abstract) May 14, 1987.

* cited by examiner

Primary Examiner—Tuyen T Nguyen
(74) Attorney, Agent, or Firm—Dellett & Walters (57) ABSTRACT

An inductor element 10 effectively functions even when formed on a substrate and comprises two upper and lower conductors 1, 2 spirally formed on the front side of a semiconductor substrate 3. The conductors 1, 2 have substantially the same shape. When viewed from the above of the front side of the substrate 3, the two conductors 1, 2 are superposed one on the other almost exactly. Lead wires 6a, 6b are connected to the outer end (outer peripheral end) and the inner end (center end) of the conductor 1, respectively. The outer end of the conductor 1 is connected to the inner end of the conductor 2 through a connection wire 6c. The conductor 1 functions as an inductor conductor and is connected to a circuit provided on the semiconductor substrate 3 through the lead wires 6a, 6b.

11 Claims, 8 Drawing Sheets

FIG. 11C

INDUCTOR ELEMENT

TECHNICAL FIELD

The present invention relates to an inductor element that can be formed on various kinds of substrates such as a semiconductor substrate.

BACKGROUND ART

There is known such a semiconductor circuit that forms a spiral pattern on a semiconductor substrate by using thin film forming technique, and uses this pattern as an inductor element. When current flows in such an inductor element that is formed on a semiconductor substrate, magnetic flux is generated in the direction perpendicular to a spiral pattern. Nevertheless, since eddy currents are induced on the front side of the semiconductor substrate by this magnetic flux to cancel effective magnetic flux, there is such a problem that doesn't effectively function as the inductor element. In particular, since the higher a frequency of a signal which flows in the inductor element becomes, the more remarkable this inclination becomes, and consequently it is difficult to form a high frequency circuit including the inductor element on a semiconductor substrate.

DISCLOSURE OF THE INVENTION

The present invention is achieved in view of such a point. Its object is to provide an inductor element that effectively functions even if the inductor element is formed on a substrate.

An inductor element according to the present invention is formed by superposing two conductors one on the other on a substrate with the two conductors sandwiching an insulating layer, one end of one of the two conductors is connected to one end of the other conductor, and the upper conductor is used as an inductor conductor. It is experimentally confirmed that an inductor element that has such structure has predetermined inductance without losing any inductance component by eddy currents etc. even if the inductor element is formed on a substrate, and hence it effectively functions as an inductor element.

In particular, it is preferable to form two conductors as described above, in the long shapes having substantially the same shape. Since an upper conductor never directly faces the front side of the substrate owing to making the two conductors the same in shapes, it is possible to reduce the eddy currents that are generated on the substrate when the upper conductor directly faces the substrate. In addition, it is possible to give predetermined inductance to the upper conductor by making the shapes of the two conductors be long. In particular, since it is possible to give large inductance to a conductor when the conductor is formed in one or more turns of spiral shape or a meander shape, the conductor is suitable for being built in a comparatively low frequency circuit. In addition, since it is possible to give a small inductance to a conductor when the conductor is formed in a circular shape less than one turn or an substantially linear shape, the conductor is suitable for being built in a comparatively high frequency circuit.

Moreover, when two conductors are made in spiral shapes, it is preferable to connect an inner end of one conductor with an outer end of another conductor. Since it is experimentally confirmed that it is possible to secure further large inductance when an inductor conductor is formed on a substrate owing to performing such connection, it is possible to realize the inductor element that effectively functions on a substrate.

In addition, the inductor element described above is suitable for use as a compound element that also has a capacitance component besides an inductance component. Since this inductor element has two conductors that are superimposed one on the other and its characteristics also include a capacitance component, this inductor element can be used in applications where an inductor and a capacitor are combined for making them a part of a circuit.

In addition, it is preferable that the inductor element described above is formed on a semiconductor substrate. In particular, if the inductor element that effectively functions can be formed on a semiconductor substrate, it is possible to form various kinds of fundamental parts, including the inductor element, on the semiconductor substrate. Hence it becomes possible to form all of the various circuits on the semiconductor substrate without using any external parts.

BEST MODE FOR CARRYING OUT THE INVENTION

Hereafter, an inductor element according to an embodiment where the present invention is applied will be specifically described with referring to drawings.

Figure 1:
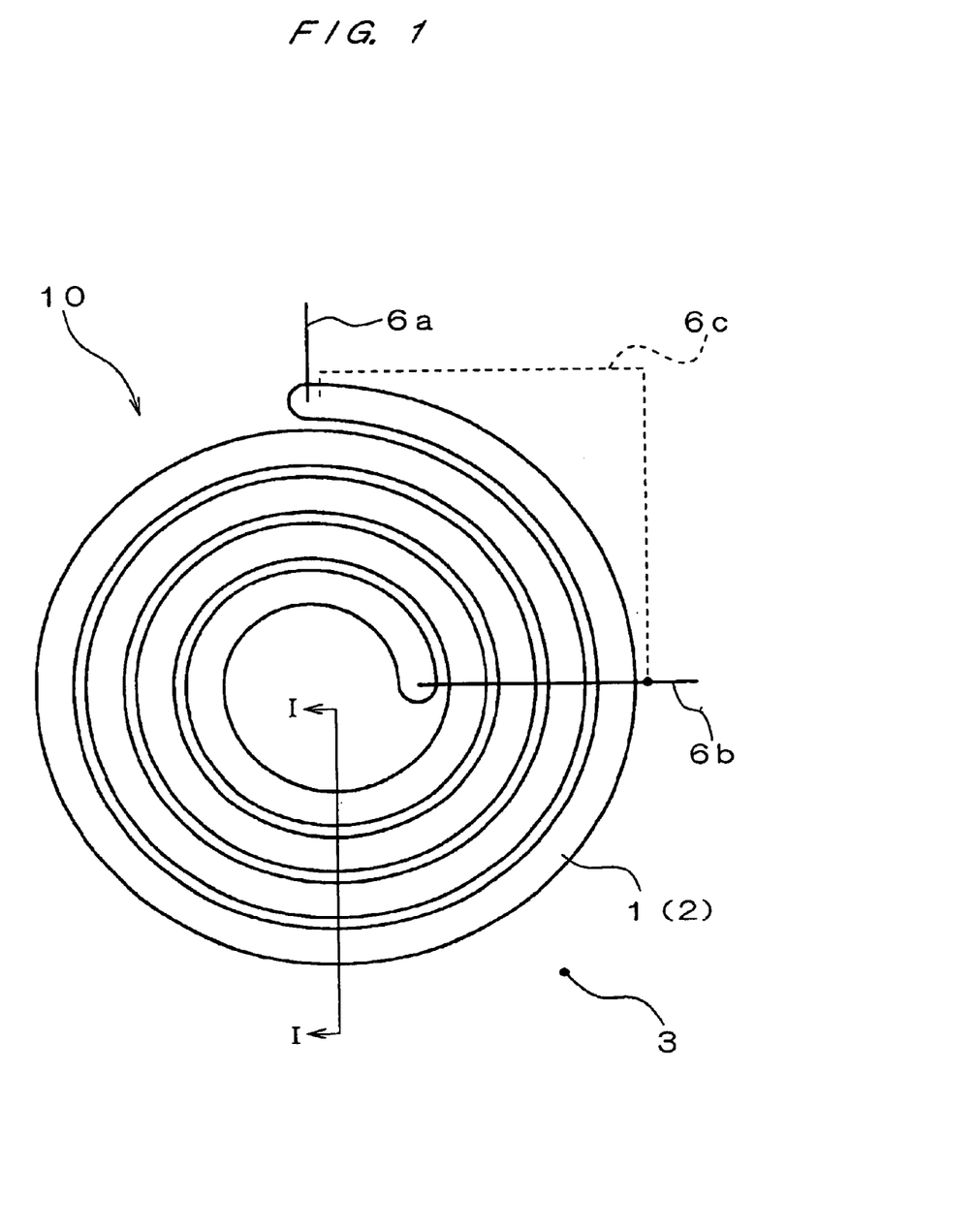
FIG. 1 is a schematic diagram showing a planar structure of an inductor element according to this embodiment.

FIG. 1 is a schematic diagram showing a planar structure of an inductor element according to this embodiment that is formed on a substrate. An inductor element 10 according to this embodiment has two conductors 1 and 2 that have spiral shapes and are formed in the front side of a semiconductor substrate 3.

These two conductors 1 and 2 have substantially the same shape. As shown in FIG. 1, when viewed from the front side of the semiconductor substrate 3, they are formed so that the conductor 1, which becomes an upper layer, and another conductor 2, which becomes a lower layer, are formed by being superimposed one on the other substantially exactly. Each of the conductors 1 and 2 is formed of a thin film of metal such as aluminum or gold, or semiconductor material such as poly silicon.

Figure 2:
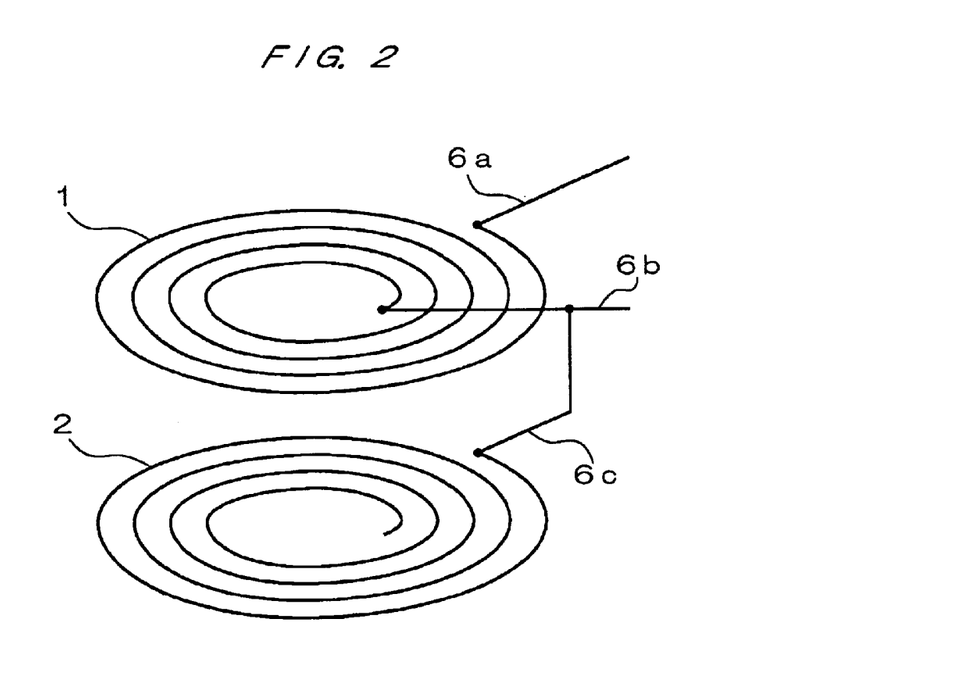
FIG. 2 is a schematic diagram showing a connection state of two conductors shown in FIG. 1.

FIG. 2 is a schematic diagram showing a connection state of the two conductors described above. As shown in FIG. 2, lead wires 6a and 6b are connected to an outer end (outer circumferential end) and an inner end (inner circumferential end) of the upper conductor 1 respectively, and the inner end of the upper conductor 1 and the outer end of the lower conductor 2 are connected with a connection wire 6c.

The upper conductor 1 functions as an inductor conductor, and is connected to a circuit (not shown) formed on the semiconductor substrate 3 through the lead wires 6a and 6b connected to ends thereof.

Figure 3:
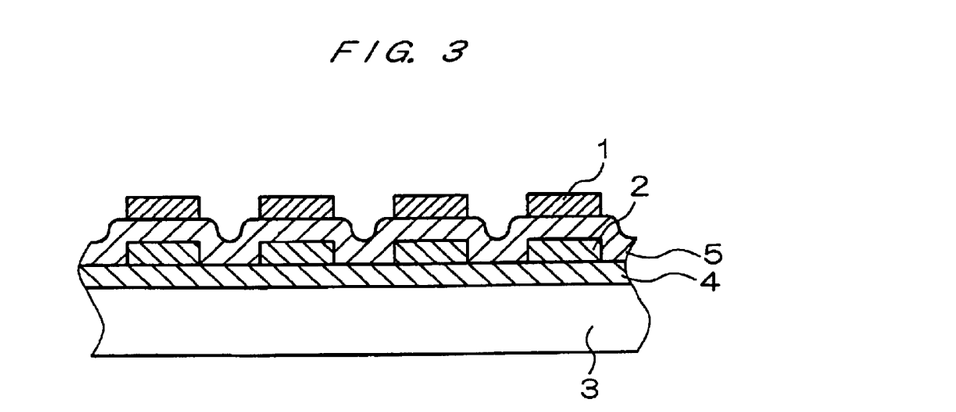
FIG. 3 is an expanded sectional view taken on a line I—I in FIG. 1.

FIG. 3 is an expanded sectional view taken on a line I—I in FIG. 1. As shown in FIG. 2, an insulating layer 4 is formed on the front side of the semiconductor substrate 3, and the conductor 2 with a spiral shape is formed in a part of a top face of the insulating layer 4. In addition, an insulating layer 5 is formed on a top face of the insulating layer 4 and conductor 2, and the conductor 1 is formed on a top face thereof.

The inductor element 10 according to this embodiment has the structure described above. Since predetermined inductance appears between two lead wires 6a and 6b connected to both ends of the upper conductor 1 respectively, this upper conductor 1 can be used as an inductor conductor. In addition, under this upper conductor 1, the conductor 2 that has substantially the same shape as this conductor 1 is formed. It is possible to suppress the generation of eddy currents in the front side of the semiconductor substrate 3 when an upper conductor 1 is used as an inductor conductor, by connecting one end of the upper conductor 1 with one end of the lower conductor 2 with the connection wire 6c. Hence it is possible to make the upper conductor 1 effectively function as an inductor conductor. Therefore, it becomes possible to integrate the entire circuit, including the inductor element, in one piece on the semiconductor substrate 3.

Next, the result of a comparative experiments for estimating the characteristics of the inductor element 10 according to this embodiment described above will be described.

Figure 4:
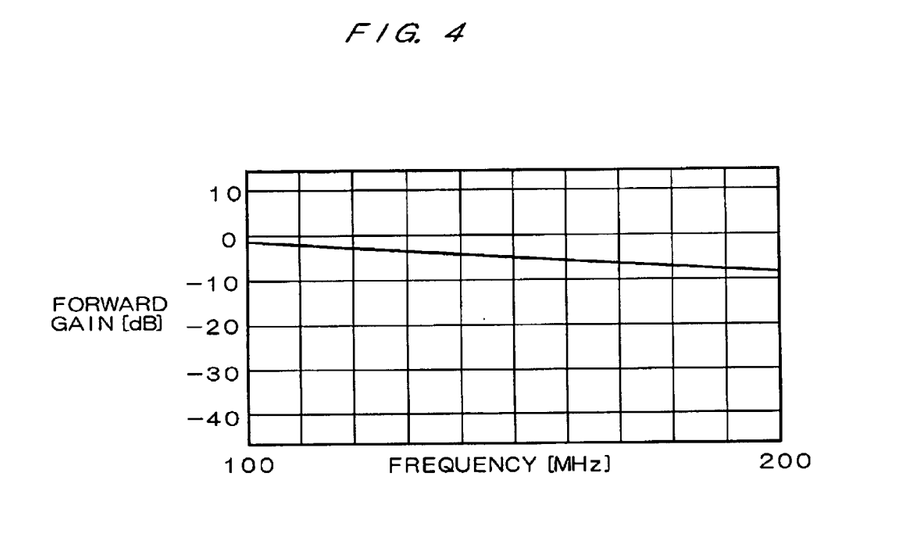
FIG. 4 is a graph showing experimental result.

FIG. 4 is a graph showing the measurement result of the forward gain of an inductor element which has an electrode of one layer having the same shape as the conductor 1 included in the inductor element 10. In addition, FIG. 5 shows a characteristic, which is the forward gain of an inductor element which has an electrode of one layer having the same shape as the conductor 1 included in the inductor element 10, at the time of closely contacting a conductor substrate to this inductor element.

As for the inductor element used in this measurement, a five-turn electrode having one-mm pattern width and a 0.2-mm adjacent gap of spiral pattern was formed on a front side of a 0.13-mm-thick insulating member with a dielectric constant of 3.17. The characteristic shown in FIG. 4 was measured with sufficiently separating this inductor element from other conductive members. The characteristic shown in FIG. 5 was measured with closely contacting a copper plate to a front side of the insulating member in an opposite electrode side of this inductor element. In addition, vertical axes in FIGS. 4 and 5 (this is the same also in FIGS. 6 and 7 which are described later) denote attenuations logarithmically expressed, and horizontal axes denote the frequencies of input signals logarithmically expressed, respectively.

In an inductor element which consists of one layer of electrode with a spiral shape, in a state that the inductor element is sufficiently separated from other conductive members, as shown in FIG. 4, as the frequency of an input signal becomes high, the forward gain becomes smaller. This is because the fact that the impedance of the inductor element having the predetermined inductance L is jωL and becomes large in proportion to the frequency of the input signal.

Figure 5:
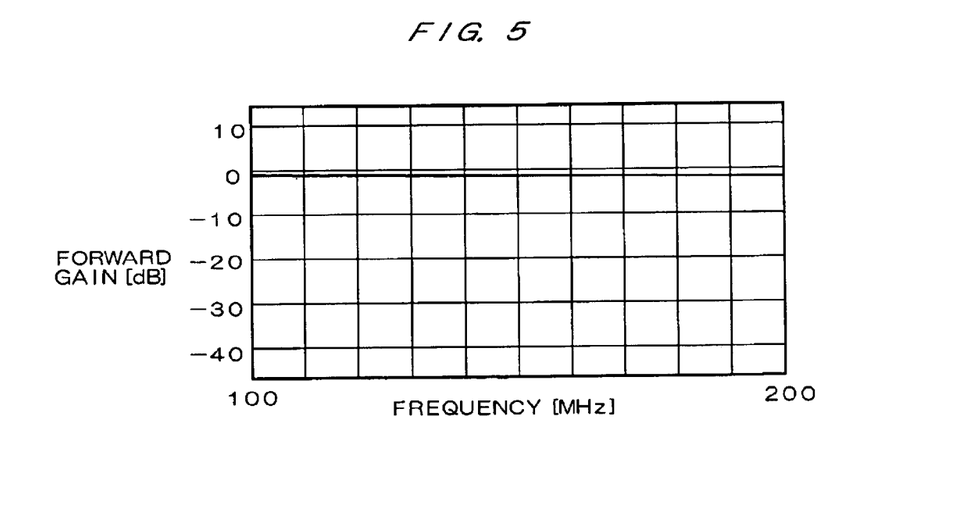
FIG. 5 is a graph showing experimental result.

On the other hand, as shown in FIG. 5, in the state that this inductor element is closely contacted to the copper plate, it is possible to maintain a high forward gain even if the input signal changes. This shows that this inductor element does not function as an original inductor since the inductance that this inductor element has becomes small by bringing the copper plate close to this inductor element. An estimated cause of decreasing the inductance is that eddy currents arise on the front side of the copper plate owing to magnetic flux, which is generated when a signal is inputted into the electrode, and cancel this magnetic flux.

In addition, in the measurement described above, although the copper plate was used as a substrate, even in the case that a semiconductor substrate is used instead of the copper plate, the same phenomenon happens fundamentally.

Figure 6:
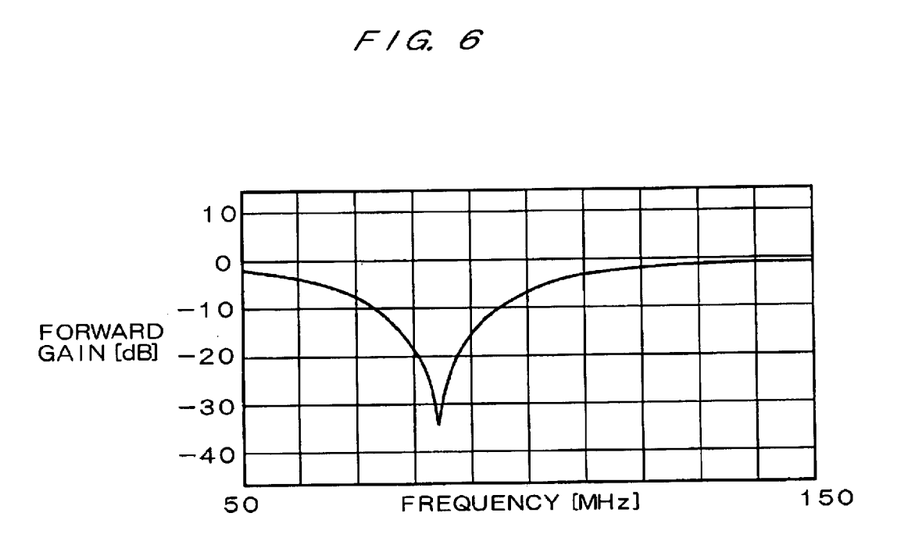
FIG. 6 is a graph showing experimental result.

FIG. 6 is a graph showing the measurement result of the forward gain of an inductor element having two layers of electrodes that have the same shape and arrangement as the two conductors 1 and 2 included in the inductor element 10. In addition, FIG. 7 shows the forward gain of an inductor element having two layers of electrodes that have the same shape and arrangement as the two conductors 1 and 2 included in the inductor element 10, at the time of closely contacting a conductor substrate to this inductor element.

The inductor element used for these measurements has the structure that an electrode corresponding to the conductor 2 shown in FIG. 1 is added to the inductor element shown in the measurement result in FIGS. 4 and 5. In addition, if closely contacting the copper plate to this inductor element, the lower electrode and copper plate are arranged through an adequate thin insulating member.

A resonance point appears at nearly 84 MHz as it is apparent from the forward gain characteristic shown in FIG. 6 in a state that the inductor element where two layers of electrodes which have spiral shapes is sufficiently separated from other conductive members. This is because this inductor element functions as a whole as a compound device that has an inductance component and a capacitance component since capacitance is produced between two electrodes while one electrode functions as an inductor conductor.

Figure 7:
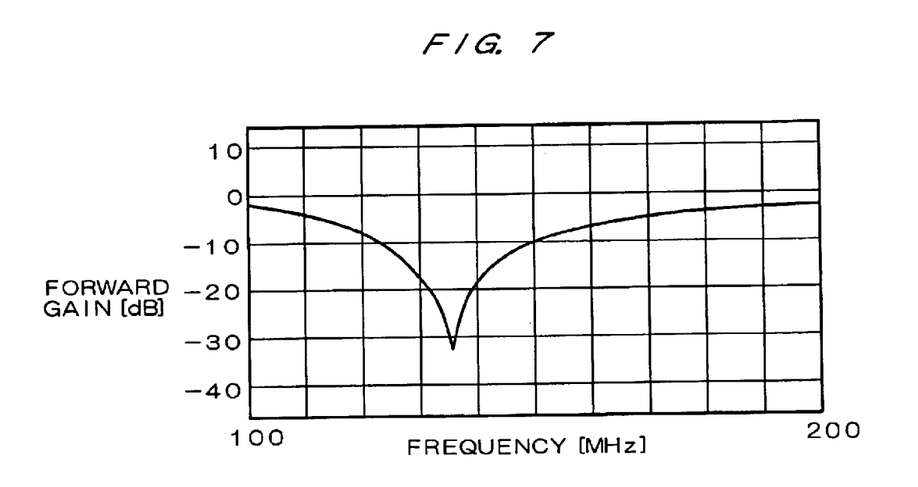
FIG. 7 is a graph showing experimental result.

In addition, in a state of closely contacting this inductor element to the copper plate, as shown in FIG. 7, a similar resonance point appears although the position of a resonance point (135 MHz) shifts. This shows that, by using the inductor element that has the double structure of the electrodes described above, even if the inductor element is closely contacting to the copper plate, the inductance component does not disappear and the function as an inductor conductor is maintained.

In addition, since the capacitance between two electrodes surely accompanies the inductor element that has double-structure electrodes, it is preferable to use it as one part of a circuit, where its resonance characteristic is used, as an application. For example, it is preferable to use it as an inductor element 10 in an oscillation circuit, a tuning circuit, or the like.

Next, a specific example at the time of using the inductor element 10 according to this embodiment described above as one part of an actual circuit will be described.

Figure 8:
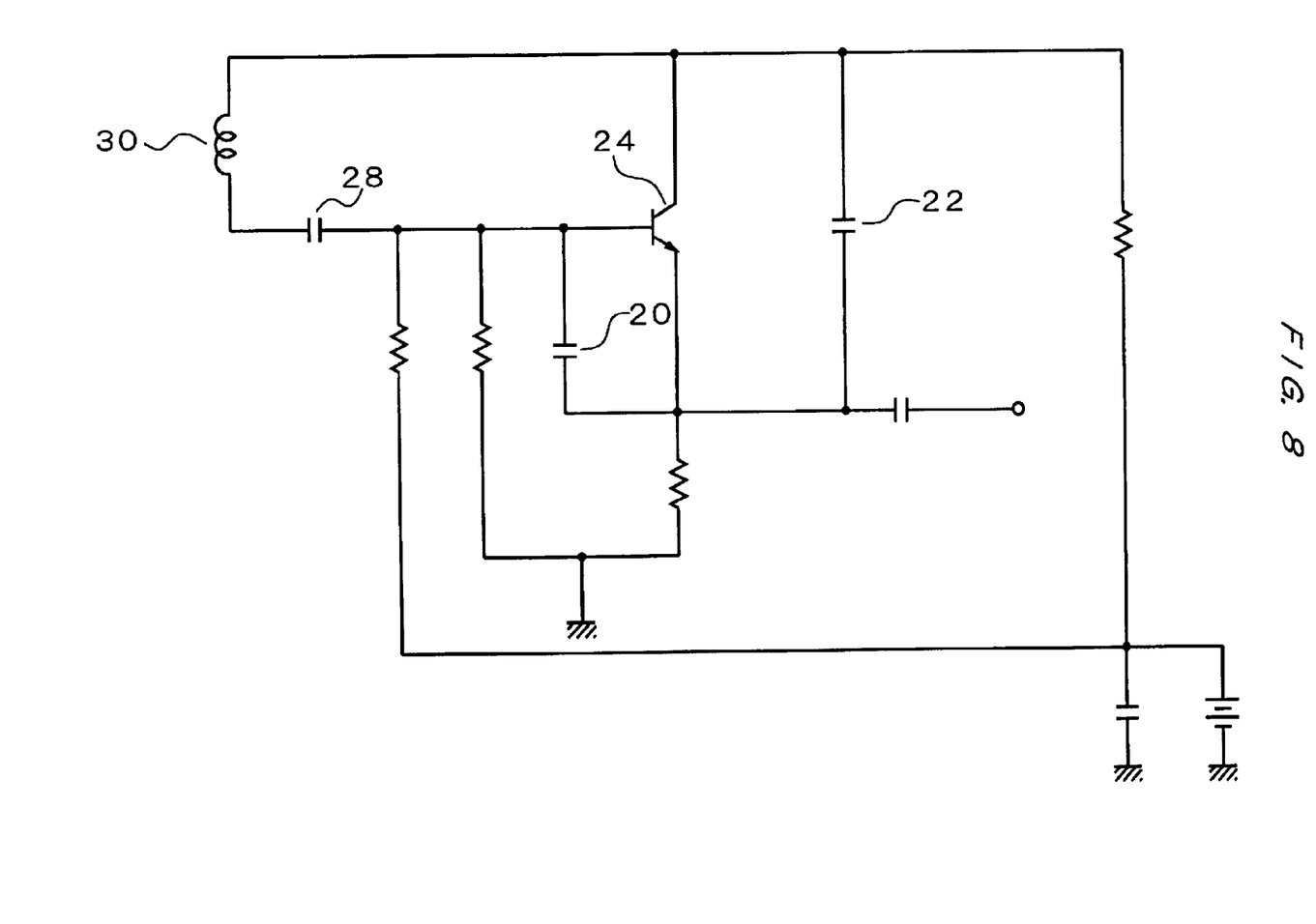
FIG. 8 is a circuit diagram of an oscillation circuit including an inductor element.

FIG. 8 shows the structure of a Clapp oscillator that is an example of an oscillation circuit constituted by using the inductor element 10 according to this embodiment. In this Clapp oscillator, the capacitance of two capacitors 20 and 22 may be several tens times the between-terminal capacity of a transistor 24. In addition, an inductor element 30 is connected through a capacitor 28.

Figure 9:
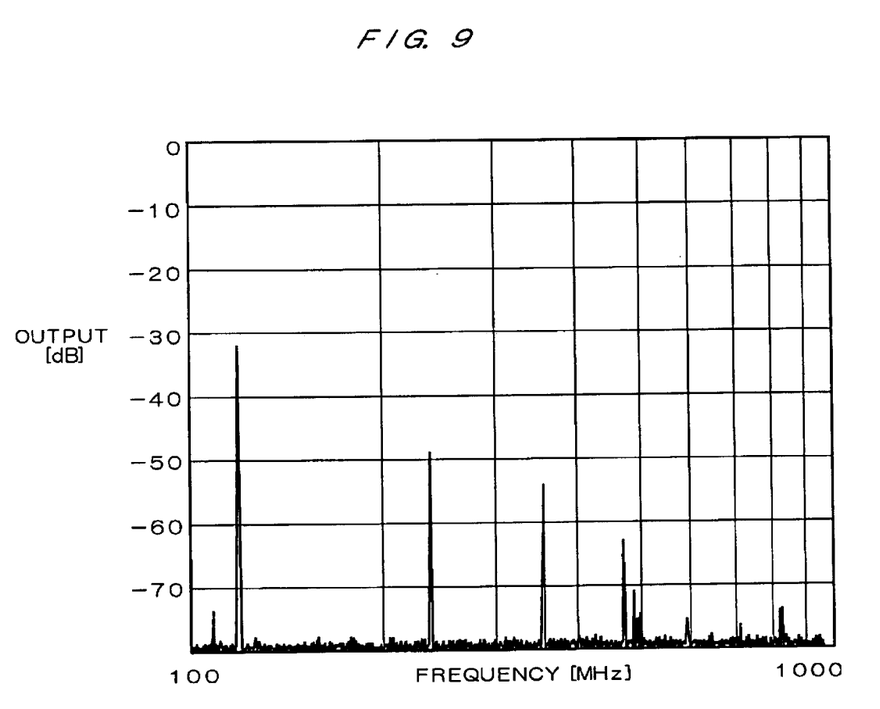
FIG. 9 is a chart showing an output characteristic of the oscillation circuit shown in FIG. 8.

FIG. 9 is a chart showing the output characteristic of an oscillation circuit where the inductor element, which has one layer of electrode and the measurements of whose forward gain is shown in FIG. 4, is used as the inductor element 30 in the Clapp oscillator shown in FIG. 8. As shown in FIG. 9, an oscillation frequency of 119 MHz was observed.

Figure 10:
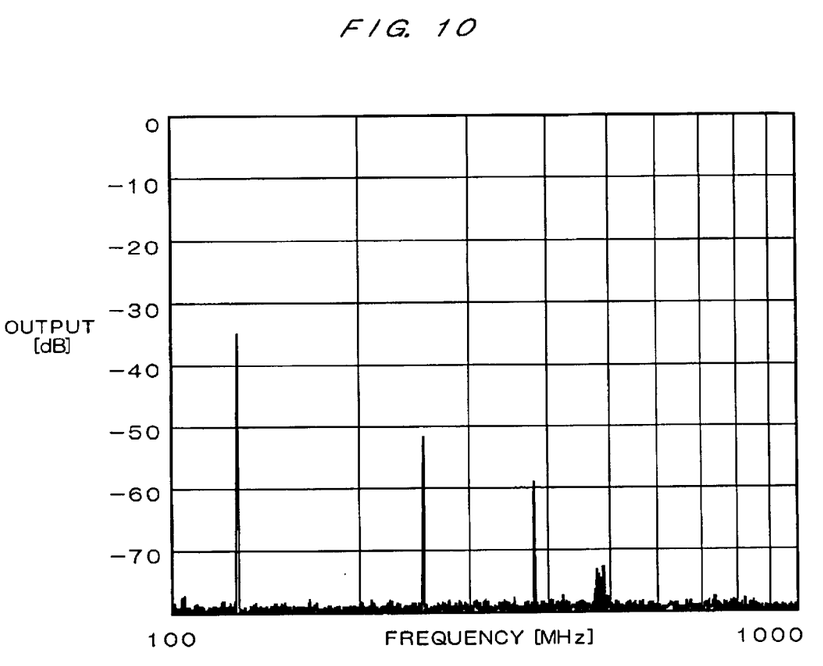
FIG. 10 is a chart showing an output characteristic of the oscillation circuit shown in FIG. 8.

In addition, FIG. 10 is a chart showing the output characteristic of an oscillation circuit where the inductor element, whose two-layer electrodes are closely contacted to the copper plate and the measurements of whose forward gain is shown in FIG. 7, is used as the inductor element 30 in the Clapp oscillator shown in FIG. 8. As shown in FIG. 10, an oscillation frequency of 127 MHz is observed.

Thus, it can be seen that the inductor element having the two-layer electrodes functions as an inductor conductor without losing an inductance component even if it is closely contacted to the copper plate in its one side (the side opposite to the electrode used as the inductor conductor). Hence, the inductor element 10 according to this embodiment which has the fundamentally same structure can effectively function as an inductor element which has predetermined inductance even if it is formed so that it may be closely contacted to the front side of the semiconductor substrate 3 by providing the lower conductor 2 besides the upper conductor 1.

In addition, the present invention is not limited to the above-described embodiment, but various types of modifications are possible within the scope of the gist of the present invention. For example, in the inductor element 10 shown in FIGS. 1 and 2, the inner end of the upper conductor 1 and the outer end of the lower conductor 2 are connected through the connection wire 6c. Nevertheless, on the contrary, it can be also performed to mutually connect the outer end of the upper conductor 1 and the inner end of the lower conductor 2. In addition, it can be also performed to connect either outer ends or both inner ends of conductors 1 and 2 when it is allowed that the inductance of an inductor element becomes small to some extent.

Figure 11A:
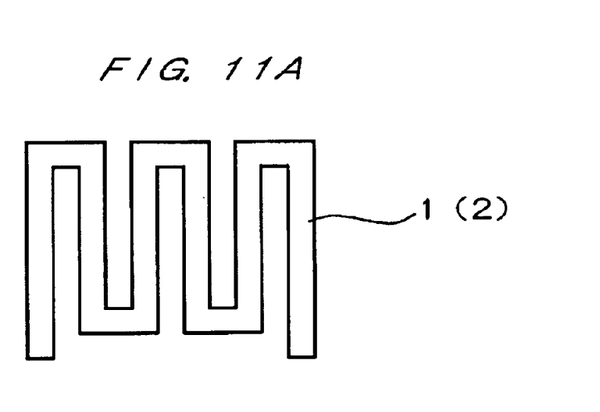
FIGS. 11A through 11C are schematic diagrams showing modified examples of the conductors included in inductor elements.
Figure 11B:
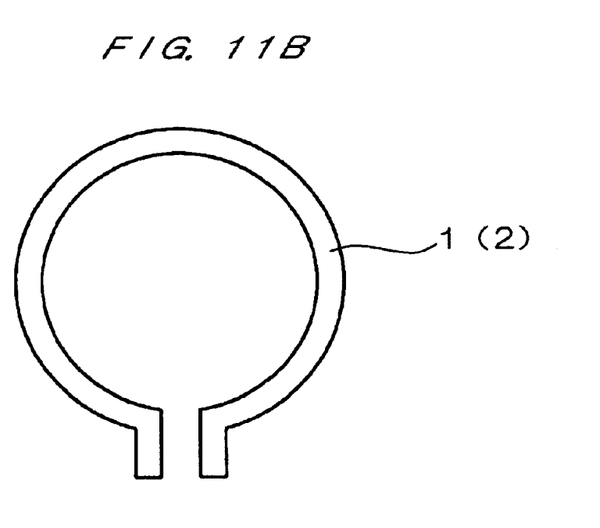
Figure 11C:
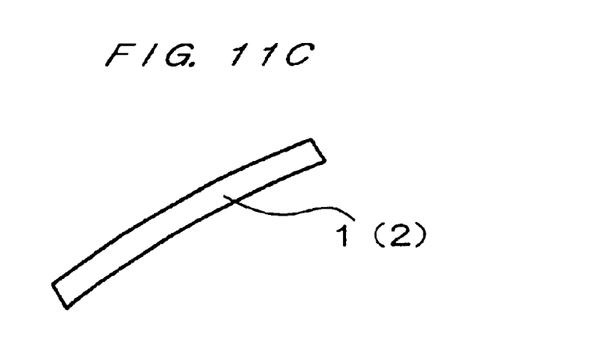

In addition, since two conductors 1 and 2 included in the inductor element 10 are formed in spiral shapes in the embodiment described above, it is possible to realize the inductor element 10 having large inductance. Nevertheless, it is also good to form two conductors 1 and 2 in meander shapes (FIG. 11A). In addition, the inductance of this inductor element 10 can be small when it is used as one part of a high frequency circuit. Hence it is also good to form the inductor element 10 less than one turn by reducing the numbers of turns of the conductors 1 and 2 (FIG. 11B), or to form it in an substantially linear shape (FIG. 11C).

In addition, although the shapes of two conductors 1 and 2 are set substantially similarly in the embodiment described above, it is also good to set them in different shapes. For example, it can be also performed to set the number of turns of the lower conductor 2 to be more than that of the upper conductors 1. Thus, since the upper conductor 1 does not directly face the semiconductor substrate 3 if all or some of the lower conductor 2 is arranged under the upper conductor 1, it is possible to effectively prevent the generation of eddy currents due to the upper conductor.

In addition, although the inductor element 10 is formed by forming two conductors 1 and 2 on the semiconductor substrate 3 in the embodiment described above, the inductor element 10 in which two conductors 1 and 2 are formed on a conductor substrate such as a metal is also realizable. From the experimental result shown in FIG. 5, it is confirmed that, even in this case, this effectively functions as the inductor element 10. If it becomes possible to form the inductor element 10 by closely contacting it on a conductor substrate, it also becomes possible to arrange the inductor element 10 on a front side of a metal shielding case or the like. Hence it becomes easy to secure an installation space of the inductor element.

INDUSTRIAL APPLICABILITY

As described above, according to the present invention, by forming two conductors one on the other on a substrate and connecting one end of one conductor with one end of the other, it is possible to use an upper conductor as an inductor conductor having predetermined inductance. Hence it is possible to make it effectively function as the inductor element. In particular, by spirally forming two conductors and connecting the inner end of one conductor with the outer end of the other conductor, it becomes possible to secure large inductance. In addition, according to the present invention, since an inductor element that effectively functions on a semiconductor substrate is realized, it becomes possible to integrate all the parts including an inductor, which is impossible up to now.

What is claimed is:

1. An inductor element, characterized in that said element comprises two conductors on a substrate, said conductors having respective inner and outer ends, a first conductor being positioned above the other conductor relative to the substrate, the first conductor being insulated from the other conductor, and the outer end of the first conductor is connected with the inner end of the other conductor, wherein the first conductor is an upper layer relative to the substrate and is used as an inductor conductor, wherein the other conductor is nearest the substrate and has an end that is open.

2. The inductor element according to claim 1, characterized in that said two conductors have substantially the same shape.

3. The inductor element according to claim 1, characterized in that said two conductors a have a first dimension being longer than a second dimension defining long shapes, and one end of one conductor in a longitudinal direction is connected with one end of the other in the longitudinal direction.

4. The inductor element according to claim 1, characterized in that said two conductors have circular shapes less than one turn.

5. The inductor element according to claim 1, characterized in that said two conductors have spiral shapes each number of turns of which is one or more.

6. The inductor element according to claim 1, characterized in that the two conductors are formed in meander shapes.

7. The inductor element according to claim 1, characterized by further comprising:

an inductance component of the conductor that is an upper layer; and a capacitance component between the two conductors.

8. The inductor element according to claim 1, characterized in that said substrate is a semiconductor substrate.

9. The inductor element according to claim 5, characterized in that said two conductors have the same number of turns in the spiral shapes.

10. The inductor element according to claim 5, characterized in that one of said two conductors has a different number of turns in the spiral shapes relative the other conductor.

11. An inductor element, characterized in that said element comprises two conductors on a substrate, said conductors having respective inner and outer ends, a first conductor being positioned above the other conductor relative to the substrate, the first conductor being insulated from the other conductor, and the outer end of the first conductor is connected with the outer end of the other conductor via a connection wire, in absence of an active circuit element, wherein the first conductor is an upper layer relative to the substrate and is used as an inductor conductor the other conductor has an unconnected end.

* * * * *